(12) United States Patent
Shuvalov

(10) Patent No.: US 9,628,057 B2
(45) Date of Patent: Apr. 18, 2017

(54) SPREAD-SPECTRUM CLOCK GENERATION CIRCUIT, INTEGRATED CIRCUIT AND APPARATUS THEREFOR

(71) Applicant: Denis Sergeevich Shuvalov, Zelenograd (RU)

(72) Inventor: Denis Sergeevich Shuvalov, Zelenograd (RU)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/909,212

(22) PCT Filed: Aug. 1, 2013

(86) PCT No.: PCT/RU2013/000664
§ 371 (c)(1),
(2) Date: Feb. 1, 2016

(87) PCT Pub. No.: WO2015/016734
PCT Pub. Date: Feb. 5, 2015

(65) Prior Publication Data
US 2016/0191029 A1 Jun. 30, 2016

(51) Int. Cl.
*G06F 1/04* (2006.01)
*H03K 5/00* (2006.01)
(Continued)

(52) U.S. Cl.
CPC ....... *H03K 5/00006* (2013.01); *H03K 3/0231* (2013.01); *H03K 25/02* (2013.01); *H03J 2200/10* (2013.01)

(58) Field of Classification Search
CPC .................................................. H03K 5/00006
See application file for complete search history.

(56) References Cited

U.S. PATENT DOCUMENTS 4,465,983 A 8/1984 Hogeboom
6,075,420 A 6/2000 Imamura et al.
(Continued)

FOREIGN PATENT DOCUMENTS

EP 1 592 154 A2 11/2005
GB 2 293 289 A 3/1996

OTHER PUBLICATIONS

IEC; "IEC 61967-3, TS, Ed.1: Integrated circuits—Measurement of electromagnetic emissions, 150 kHz to 1 GHz—Part 3: Measurement of radiated emissions—Surface scan method"; 24 pages (Apr. 9, 2004).
(Continued)

*Primary Examiner* — Daniel Puentes
(74) *Attorney, Agent, or Firm* — Charlene R. Jacobsen

(57) ABSTRACT

A spread-spectrum clock generation circuit comprises at least one comparison element; at least one charge storage device arranged to couple an output of the at least one comparison element to an input of the at least one comparison element and arranged to set a first oscillation frequency of the spread-spectrum clock generation circuit; and a switched charge storage arrangement additionally arranged to couple an output of the at least one comparison element to an input of the at least one comparison element and arranged to set a second oscillation frequency of the spread-spectrum clock generation circuit.

19 Claims, 5 Drawing Sheets

(51) Int. Cl.
*H03K 3/0231* (2006.01)
*H03K 25/02* (2006.01)

(56) References Cited

U.S. PATENT DOCUMENTS

| | | | |
|---|---|---|---|
| 6,326,859 B1 * | 12/2001 | Goldman | H03K 3/011 |
| | | | 331/111 |
| 6,980,039 B1 | 12/2005 | Dening | |
| 7,098,709 B2 | 8/2006 | Ido et al. | |
| 7,843,278 B2 | 11/2010 | Hsu | |
| 2008/0130712 A1 | 6/2008 | Chava et al. | |
| 2009/0160503 A1 | 6/2009 | Chen et al. | |

OTHER PUBLICATIONS

IEC; "IEC 61967-4: Integrated circuits—Measurement of electromagnetic emissions, 150 kHz to 1 GHz—Part 4: Measurement of conducted emissions—1 Ω/150 Ω direct coupling method"; 29 pages (Jan. 18, 2002).

International Electrotechnical Commission; "International Special Committee on Radio Interference (CISPR)—A Guidance for users of the CISPR Standard"; 24 pages Sep. 2008).

International Electrotechnical Commission; "Radio disturbance characteristics for the protection of receivers used on board vehicles, boats, and on devices—Limits and methods of measurement"; Reference No. CISPR 25:2002; 132 pages (Aug. 2002).

International Search Report for application PCT/RU2013/000664 (May 2, 2014).

* cited by examiner

FIG. 1-PRIOR ART

SPREAD-SPECTRUM CLOCK GENERATION CIRCUIT, INTEGRATED CIRCUIT AND APPARATUS THEREFOR

FIELD OF THE INVENTION

The field of this invention relates to a spread-spectrum clock generation circuit, integrated circuit and an apparatus, such as a clock system, therefor, and in particular to a circuit for varying an oscillation frequency of a switched current oscillator of a switched-mode power supply unit.

BACKGROUND OF THE INVENTION

Synchronous systems and circuits, for example switch-mode power supplies (SMPS), microcontrollers, integrated digital/logic cores, etc. are often causing an undesired electromagnetic interference (EMI). Such systems and circuits are driven by a clock signal, which due to its periodic nature, creates an unavoidably narrow frequency spectrum and radiate electromagnetic energy across a number of narrow bands spread around the clock frequency as well as the clock frequency harmonics. This results in a frequency spectrum that, at certain frequencies, may exceed the regulatory limits for electromagnetic interference set, for example, by EMI standards e.g. CISPR-25, IEC 61967.

Spread-Spectrum Clock Generation (SSCG) is a technique that has been utilised in the art to help reduce this generated EMI. Generally, in SSCG, the clock frequency is modulated such that the same energy is spread out over a wider bandwidth, which prevents systems from placing enough energy into any one narrowband to exceed the statutory limits. In addition to potentially reducing any EMI from the fundamental system clock frequency, SSCG may also help attenuate EMI generated in successive clock harmonics.

There are a number of different types of oscillators that can be used in clocked systems. One such oscillator type, referred to as a switched current oscillator, is based on a capacitance charge/discharge process. Generally, in the art (e.g. U.S. Pat. No. 7,504,897), frequency modulation (via SSCG) of such oscillators is achieved by varying capacitance, current or voltage (supply voltage or switching threshold) at a speed that is similar to an oscillation frequency of the oscillator. Often modulation is performed by periodic signals (that are not perfect due to low frequency tones appearing causing EMI) or by pseudo-random signals generated by programmable pseudo-random number generators (PPRNG).

FIG. 1 illustrates a typical oscillator circuit for clock frequency spreading. Oscillator circuit 100 comprises current source 110, variable capacitor 120, PPRNG 130, FET 140 differential (input) comparator 150, flip-flop 160 and positive feedback capacitor C1. The differential comparator 150 compares sensed voltage 105 with reference voltage VREF. Oscillation happens by charging variable capacitance 120 by current source 110 until a voltage at node 105 reaches reference voltage VREF. Then comparator 150 switches and discharges variable capacitance 120 by FET 140. The voltage on node 105 then drops to zero and the comparator switches again, and so forth. FET 140 must discharge variable capacitor 130 quickly, as otherwise it affects the accuracy of the oscillator circuit 100. Further, in the oscillator circuit 100 of FIG. 1, flip flop 160 is required to provide a 50% duty cycle as only a single current source is utilised.

It is also known that current source 110 and FET 140 may be implemented as two current sources, each with a series switch (e.g. a FET) controlled in opposite phases by comparator 150. In these known implementations, a small capacitor (C1) is utilised to aid the differential comparator 150 in order to fully trip and to generate an appropriately shaped pulse.

Frequency modulation (through SSCG) is performed by varying the capacitance value provided by the variable capacitor 120, which is controlled by Programmable Pseudo-Random-Number Generator (PPRNG) 130 via a control signal (SYNC). The control signal is normally derived from an output of the oscillation circuit 100. A multiple-bit leap-forward linear feedback shift register (LFSR) is widely used for generation of pseudo random (for example in a PPRNG) or true random numbers in communication and encryption.

The implementation of variable capacitor 120 is problematic. For example, the overall capacitance of variable capacitor 120 needs to be relatively small for typically required oscillation frequencies. However, in contrast, a desire to provide 'uniform' clock frequency spreading by SSCG often requires a higher resolution of PPRNG (i.e. a relatively large number of bits being used). This requirement, together with the fact that a minimum reproducible value of unit capacitance is limited in integrated technologies, leads to a need to have a larger overall capacitance value for variable capacitor 120. As a result, this trade-off typically leads to increased cost and/or to increased power consumption in SSCG implementations. In addition, the resolution of a PPRNG and the possible clock spreading frequency bandwidth are closely inter-related, and it is therefore very difficult to modify either without affecting the other.

Alternatively, SSCG may also be implemented by modulation of a current (e.g. current source 110) or of a voltage (e.g. VREF modulation). Such implementations require current or voltage output, digital-to-analog converter (DAC) usage together with a PPRNG. This again leads to cost and/or to consumption increase.

U.S. Pat. No. 6,075,420 and U.S. Pat. No. 4,465,983 describe switched current oscillator circuits having a positive feedback capacitor that do not support SSCG.

SUMMARY OF THE INVENTION

The present invention provides a spread-spectrum clock generation circuit, an integrated circuit and an apparatus such as a switched-mode power supply unit comprising a spread-spectrum clock generation circuit, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

The present invention will now be described with reference to an example spread spectrum clock generation oscillator circuit, an integrated circuit comprising an oscillator circuit and an apparatus, such as say, a switched-mode power supply unit or a synchronous digital system (such as integrated microcontrollers, digital/logic cores), and adapted in accordance with some embodiments of the present invention. However, it will be appreciated that the inventive concept described herein is not limited to specific features of the illustrated example, and may equally be implemented within alternative communication units, integrated circuits and applications. In some examples, a spread spectrum generation circuit and an apparatus such as a switched mode power supply is described that has a defined clock spreading frequency bandwidth that may not depend on the PPRNG resolution (number of bits).

Figure 1:
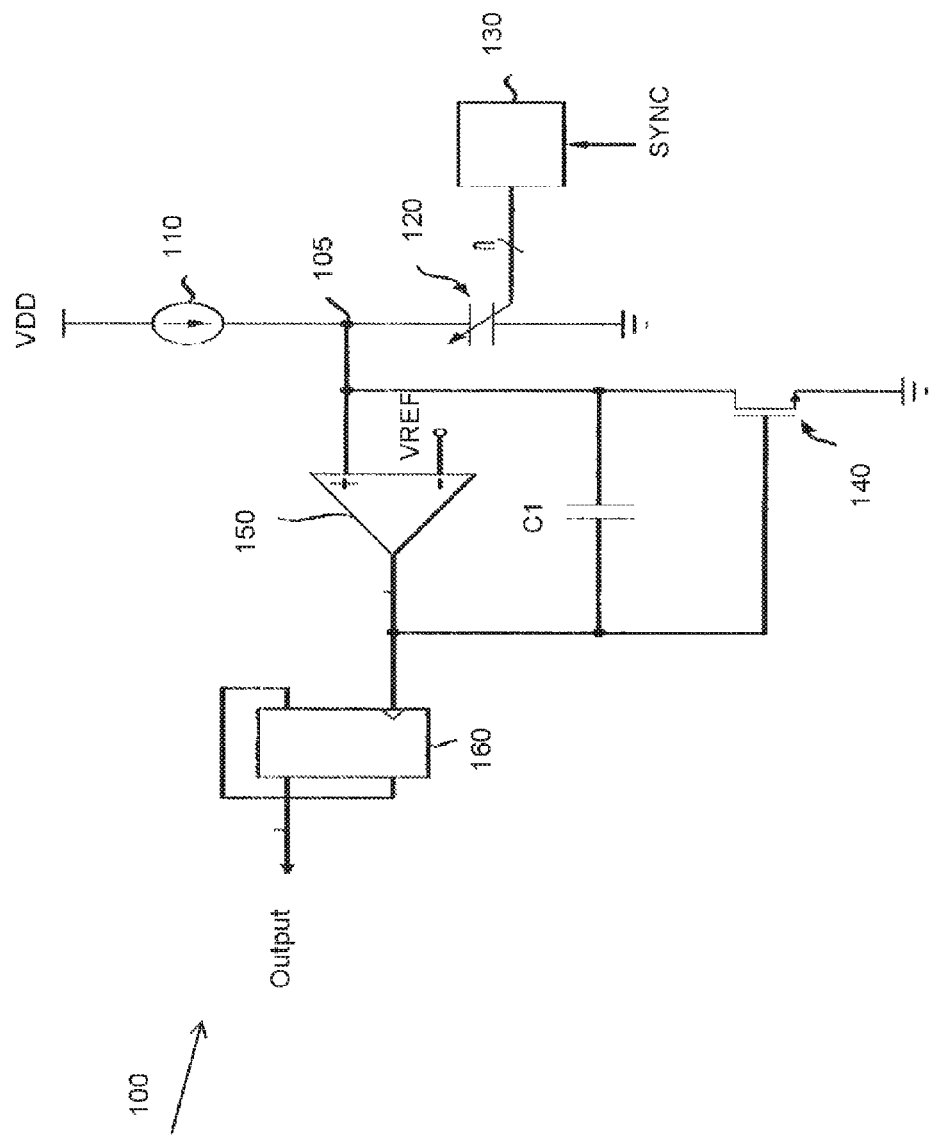
FIG. 1 schematically shows a known oscillator circuit for clock frequency spreading.
Figure 2:
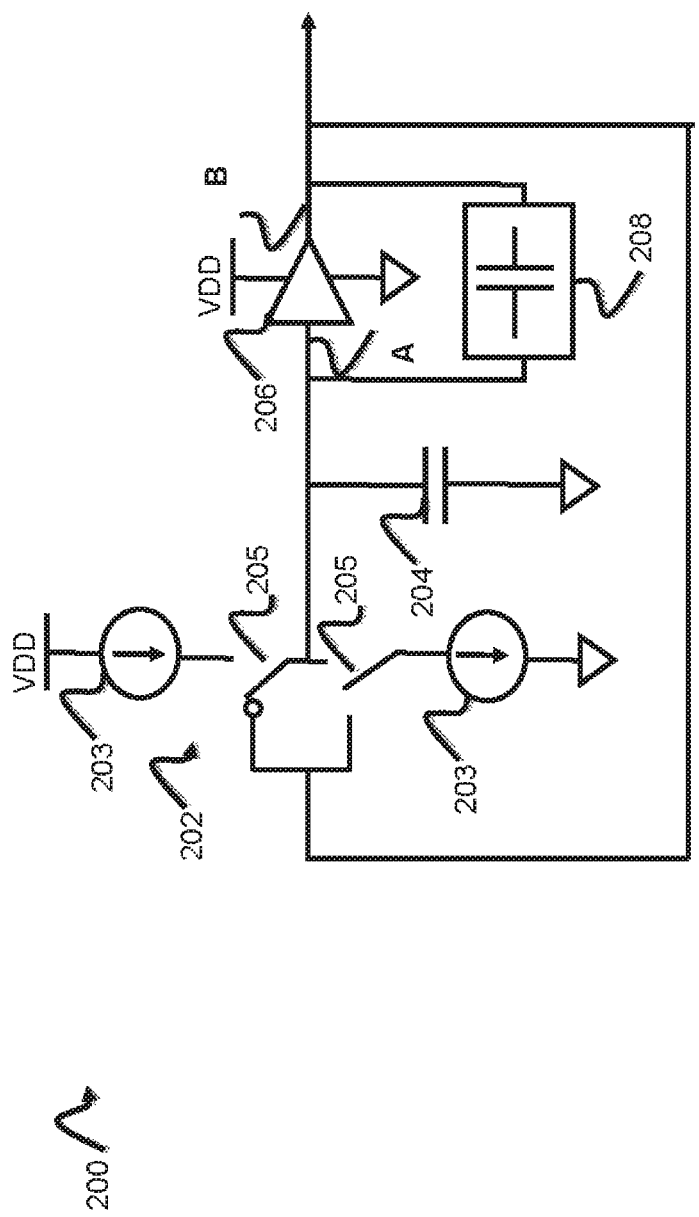
FIG. 2 schematically shows an example of an oscillator circuit for spread spectrum clock generation.

FIG. 2 schematically shows an example of an oscillator circuit 200 used as a core of spread spectrum clock generation. In this example, oscillator circuit 200 may comprise a switched current network 202, operably coupled to a comparison element 206 via a shunt charge storage device 204. The example oscillator circuit 200 comprises a, comparison element 206 and charge storage arrangement 208. In some examples, additional circuitry may be utilized to compensate temperature, supply or process dependence.

In this example, switched current network 202 may comprise more than one current source 203. Further, switched current network 202 may be switched via at least one switching device 205. In this example, an array of two switching devices 205 is utilised. In other examples, a plurality of switching devices may be used. In some examples, the at least one switching device 205 may be one of a type of field effect transistor (FET), junction field effect transistor (JFET) metal oxide semiconductor field effect transistor (MOSFET), bipolar junction transistor (BJT), or the like. Further, the at least one switching device 205 may be formed of traditional materials, such as amorphous silicon, polycrystalline silicon and organic materials. Further, the at least one switching device 205 may be formed utilising materials such as carbon, in the form of carbon nanotubes or graphene, for example. In some examples, switching devices 205 may utilise the same type of device. In other examples, different devices may be utilised for each switching device 205.

In some examples, switched current network 202 may be operably coupled between a supply voltage VDD and a ground terminal. In some examples, the shunt charge storage device 204 may comprise a capacitor, for example an electrolytic, polymer or solid dielectric type capacitor. In some examples, shunt charge storage device 204 may be utilised to limit a voltage applied to an input of comparison element 206. In some examples, the charge storage device may comprise a series of charge storage devices. In some examples, the charge storage device 204 may be operably coupled to comparison element 206.

In some examples, comparison element 206 may comprise a single threshold comparator. In other examples, comparison element 206 may comprise a differential type comparator. Further, comparison element 206 may be formed of a series of logic gates, for example inverters. In some examples, comparison element 206 may be formed of at least two inverter logic gates, thereby approximating a single threshold comparative element. In other examples, a plurality of logic gates may be utilised to approximate the function of a single threshold comparative element. In some examples, comparative element 206 may be operably coupled to a voltage supply VDD.

In some examples oscillator circuit 200 may utilise the same voltage source. In other examples, different voltage sources may be utilised for different parts of the oscillator circuit 200. In some examples, a charge storage arrangement (which is some examples is a charge storage circuit) 208 may be operably coupled at the input and output of comparison element 206. In some examples, the charge storage arrangement 208 may comprise a (positive) feedback capacitor to set a first oscillation frequency, and a parallel switched charge storage arrangement to set a second oscillation frequency. In some examples, parallel switched charge storage arrangement may comprise an array of charge storage elements. In some examples, the charge storage arrangement 208 is operably coupled in a feedback arrangement, whereby a capacitive value of the charge storage device (e.g. positive feedback capacitor) sets/affects a frequency modulation/frequency spreading/dithering of the oscillation frequency of oscillator circuit 200.

In operation, the input 'A' represents a capacitance that is a sum of the capacitance value of shunt charge storage device 204 and charge storage arrangement 208. If we assume that an initial voltage 'A' on the input of the comparator 206 is above a threshold voltage $V_{TH}$ of the comparator 206 and the input 'A' is discharged by the discharging branch of the switched current network 202 to the threshold voltage of the comparator, the potential at the input 'A' will be gradually decreased. When the input 'A' has fallen to slightly below the threshold voltage $V_{TH}$ of the comparator 206, the output 'B' of the comparator 206 switches to another state, which causes an abrupt drop of the potential of input 'A' due to charge storage arrangement 208, thereby causing a charging current to flow into the input 'A' of the comparator from the charge branch of the switched current network 202. This, in turn, causes the potential at the input 'A' to gradually increase. When the input 'A' has risen to slightly above the threshold voltage $V_{TH}$ of the comparator 206, the output 'B' of the comparator 206 switches to another state and this causes an abrupt rise to the potential of input 'A' due to charge storage arrangement 208, thereby causing a discharging current to flow into the input 'A' of the comparator 206. This repeated cycle of discharging and charging enables the production of an oscillation signal on the output 'B'.

A value of abruptly drop/rise voltage on the input of the comparator is defined by an output voltage swing on the output 'B' of the comparator 206, which is, for example, VDD and a division ratio of capacitive divider formed by shunt charge storage device 204 and charge storage arrangement 208. This change value may be defined as:

$$\Delta V = VDD*Cf/(Ci+Cf) \qquad [1]$$

where:

Cf is a capacitance representing switched charge storage arrangement 208,

Ci is a capacitance representing shunt charge storage device 204.

In addition to the above, the time required to change the voltage on the input 'A' of the comparator 206, to gradually drop/rise back to the $V_{TH}$ value from a previous abruptly risen/dropped voltage may be defined as:

$$T_{RISE} = \Delta V^*(Ci+Cf)/I_{RISE} = VDD^*Cf/I_{RISE} \text{ and}$$
$$T_{DROP} = \Delta V^*(Ci+Cf)/I_{DROP} = VDD^*Cf/I_{DROP} \quad [2]$$

where $I_{RISE}$ and $I_{DROP}$ are the charge and discharge currents formed by switched current network 202.

In some examples, it may be possible to simplify the resulting expression to: $I_{RISE} = I_{DROP} = I$. Thus, the oscillator frequency (f):

$$f = 1/(T_{RISE} + T_{DROP}) = I/(2^*VDD^*Cf) \quad [3]$$

One can note that the oscillation frequency, f, does not depend on the value of shunt charge storage device 204 (Ci) or on an exact value of the threshold ($V_{TH}$) of the comparison element 206. Instead, the oscillation frequency, f, allows using a single input comparator that, in one simple implementation example, may be a chain of inverters.

Figure 3:
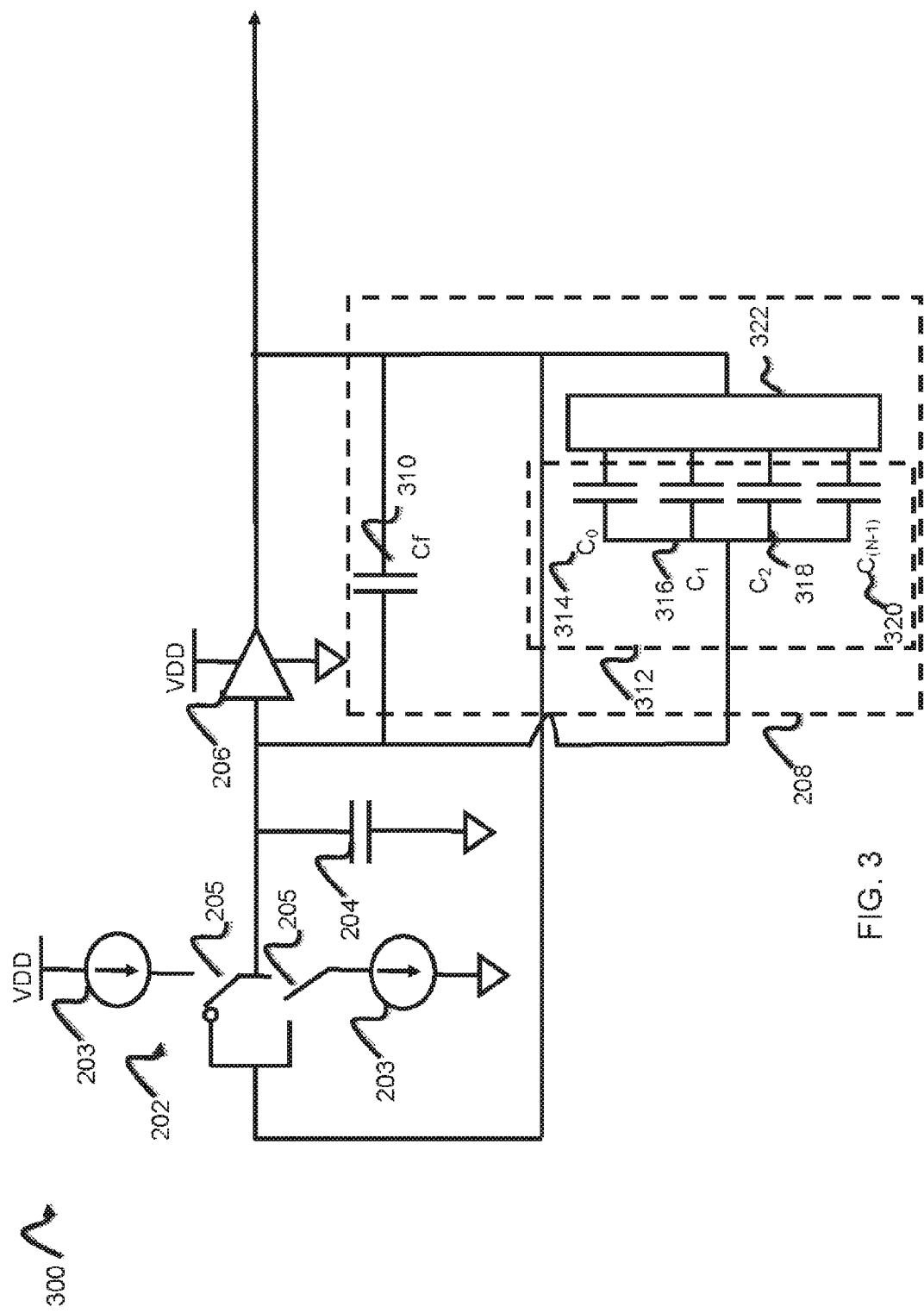
FIG. 3 schematically shows a further example of an oscillator circuit for spread spectrum clock generation.
Figure 4:
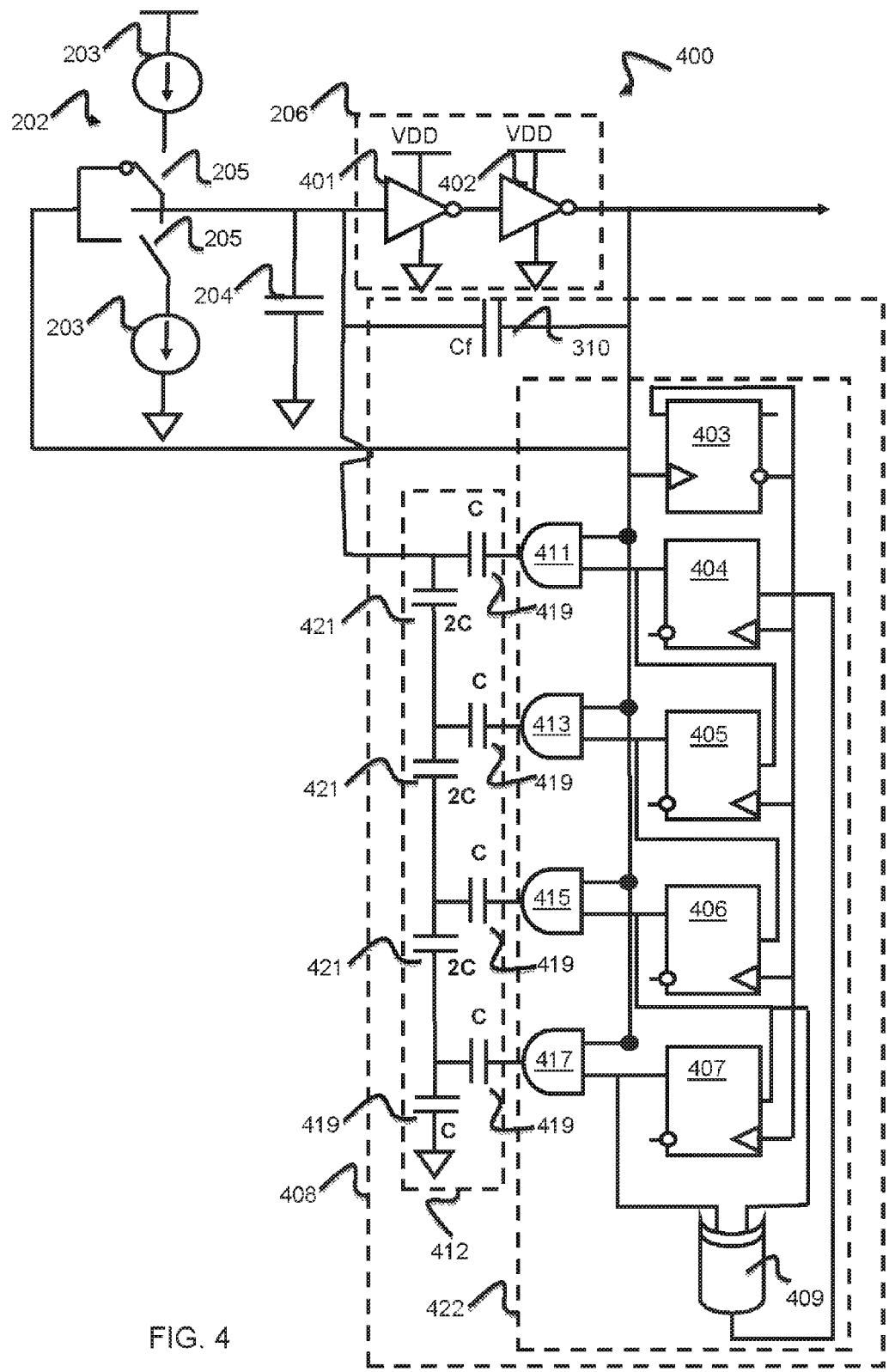
FIG. 4 schematically shows a further example of an oscillator circuit for spread spectrum clock generation.

In some examples, charge storage arrangement 208 may be implemented as a feedback capacitor (Cf) located in parallel to a switched capacitor arrangement, examples of which are illustrated further in FIG. 3 and FIG. 4. In some examples, the feedback capacitor (Cf) may comprise a plurality of feedback capacitors in order to create a desired Cf value.

In some examples, feedback capacitor (Cf) may comprise one or more additional charge storage element(s)/device(s).

In some examples, frequency modulation/spreading/dithering is performed by selectively applying (activating in the circuit) a number of simultaneously switched charge storage devices, for example capacitors that are located in parallel to feedback capacitor (Cf), as further described with respect to FIG. 3 and FIG. 4. In some examples, simple logic gates can be utilized to achieve this selective switching operation. In some examples, a 'C-2C' digital-to-analog (DAC) circuit/arrangement may be used to represent a number of simultaneously switched capacitors, to enable the clock-frequency spreading bandwidth to not be dependent upon a DAC's resolution, as further described with respect to FIG. 4. In some examples, a number of the simultaneously switched capacitors in parallel to a feedback capacitor (Cf) may be controlled by PPRNG, implemented as a linear feedback shift register (LFSR), which in some examples is used as a pseudo-noise sequence generator.

Referring to FIG. 3, a schematic diagram illustrating a further example of an oscillator circuit for spread spectrum clock generation is shown. FIG. 3 comprises features already described with reference to FIG. 2 and, therefore, only new features are discussed in any detail.

In some examples, charge storage arrangement 208 may comprise a charge storage device, for example, feedback capacitor (Cf) 310 and a switched charge storage arrangement 312. In some examples, feedback capacitor (Cf) 310 may comprise a single charge storage device/element. In some examples, feedback capacitor (Cf) 310 may comprise more than one charge storage device/element, forming an arrangement of charge storage devices/elements. In some examples, switched charge storage arrangement 312 may comprise a plurality of charge storage elements 314, 316, 318, 320. In some examples, charge storage elements 314, 316, 318 and 320 may all have the same capacitance value. In other examples, the charge storage elements 314, 316, 318 and 320 may be binary weighted. In further examples, some or all of charge storage elements 314, 316, 318 and 320 may have different capacitances. In further examples, a number of the charge storage elements 314, 316, 318 and 320 may be different, i.e. more or less than the four elements shown in this example.

In some examples, feedback capacitor (Cf) 310 defines a first capacitance that is operable to set a first oscillation frequency of oscillator circuit 300. In some examples, switched charge storage arrangement 312, located in parallel to feedback capacitor (Cf) 310, is arranged to define a second capacitance that is operable to set a second oscillation frequency of oscillator circuit 300.

In some examples, switched charge storage arrangement 312 may be controlled via a switching module 322. In some examples, switching module 322 may be a PPRNG implemented as a linear feedback shift register (LFSR). In some examples, switching module 322 may contain extra components/gates than mentioned with respect to the illustrated PPRNG or LFSR. In other examples, switching module 322 may be any device that may allow for a pseudo-random switching sequence to be performed. In other examples, switching module 322 may be any device or component that may allow for a systematic switching sequence to be performed. In some examples, switching module 322 may enable at least one charge storage element 314, 316, 318 and 320 of a plurality of selectable charge storage elements, located in parallel with feedback capacitor (Cf) 310, to define the second oscillation frequency of oscillator circuit 300.

In other examples, feedback capacitor (Cf) 310 may be disabled, and the second oscillation frequency may be set using solely one or more of selectable charge storage elements 314, 316, 318, 320. As one or more or each of charge storage elements 314, 316, 318 and 320 may be selectively enabled, they may also be selectively disabled, for example where only the first oscillation frequency defined by feedback capacitor (Cf) 310 is required.

In some examples, feedback capacitor (Cf) 310 may define a minimum capacitance, thereby providing a maximum oscillation frequency. In other examples, switched charge storage arrangement 312 may define a capacitance that, when combined with feedback capacitor (Cf) 310, provides a minimum oscillation frequency.

In other examples, switched charge storage arrangement 312 may provide a range of capacitance values between a maximum and a minimum value, wherein a minimum value may be set by the feedback capacitor (Cf) 310 alone with the maximum value being set by the total capacitance of switched charge storage arrangement 312 in parallel combination with the feedback capacitor (Cf) 310. Thus, in some examples, a range of available capacitance values may be set by enabling one or more charge storage elements 314, 316, 318 and 320.

In some examples, charge storage arrangement 208 may dynamically alter the switching frequency of the oscillator circuit 300, thereby allowing for spread spectrum clock generation. In some examples, switching module 322 may switch charge storage elements 314, 316, 318 and 320 in a simultaneous fashion. In other examples, switching module 322 may switch charge storage elements 314, 316, 318 and 320 in an asynchronous fashion. In some examples, the pseudo-random switching sequence may be advantageous in reducing periodic switching patterns within the switching sequence, thereby potentially reducing an appearance of low frequency signals within the spectrum.

In some examples, the oscillation frequency of oscillator circuit 300 may be selected as any value between the minimum and maximum oscillation frequency, by enabling one or more charge storage devices within switched charge storage arrangement 312 to be controlled in a periodic or pseudo-random fashion. It is noted that when there are no charge storage elements that are simultaneously switched in parallel to the feedback capacitor (Cf) 310, then this case corresponds to maximum oscillation frequency of oscillator defined as:

$$f_{OSC\_MAX}=I/(2*VDD*Cf). \quad [4]$$

In contrast, when all storage elements (e.g. with a summed capacitance Ca) are simultaneously switched in parallel to the feedback capacitor (Cf) 310, then this corresponds to a minimum oscillation frequency of:

$$f_{OSC\_MIN}=I/(2*VDD*(cf+ca)). \quad [5]$$

Thus, the spectral band of clock frequency spreading may be defined as:

$$\Delta f_{OSC}=f_{OSC\_MAX}-f_{OSC\_MIN} \quad [6]$$

with a center frequency $f_{OSC}=(f_{OSC\_MAX}+f_{OSC\_MIN})/2$. [7]

where:

$$\Delta f_{OSC}/f_{OSC}=2*Ca/(2*Cf+Ca)=Ca/Cf. \quad [8]$$

In some examples, switching module 322 may control a weighted capacitor array. In this example, the weighted capacitor array may comprise four charge storage devices 314, 316, 318 and 320 with respective unit capacitances 'C', '2C', '4C', '8C'. In some examples, the total unit capacitance of the switched charge storage arrangement 312 may be defined by $2^N-1$, where 'N' is the number of bits of the switching module 322.

Therefore, in this four, charge storage example, a total of '15C' unit capacitances may be required to implement a 4-bit clock frequency spreading on sixteen different frequencies distributed over the desired band. If we assume that for a practical case a second oscillator range (namely clock frequency spreading band) of 10% is required (e.g. $\Delta f_{OSC}/f_{OSC}=10\%$), the four charge storage example would require a feedback capacitor value of Cf='150C'. Therefore, any change in a number of bits being used (and/or the summed Ca value) necessarily leads to a corresponding change of the feedback capacitor, Cf, value, and consequently a change to the oscillator properties (e.g. oscillation frequency and clock frequency spreading band).

Thus, in some examples, it may be needed to distribute a clock frequency on a larger number of frequencies, in order to minimize emission magnitude. Thus, for example, switching module 322 may comprise a 10-bit LFSR for switching a switched charge storage arrangement 312. In this example, utilising the above equations, Ca='1023C' and Cf='10230C'' unit capacitances may be required.

In one illustrated example, 4-bit clock frequency spreading may require Ca='15C', Cf='150C'. In known integrated circuit implementations, such values would typically represent a too large a capacitance for practical integrated circuit implementation, as high order clock frequency spreading with more than '4' bits cannot readily be supported.

In some examples, it may be advantageous to provide a switched charge storage arrangement that utilises fewer devices than currently utilised in the art for a given bit size of the switching module 322. Further, in some examples, it may be advantageous to provide a switched charge storage arrangement wherein the switching frequency provided by the switched charge storage arrangement may be pre-defined and not dependent upon a number of bits of a switching module 322.

Referring to FIG. 4, a schematic diagram illustrates a further example of an oscillator circuit for spread spectrum clock generation 400. FIG. 4 comprises features already described with reference to FIG. 2 and FIG. 3 and, therefore, only new features are discussed in any detail. In this example, comparison element 206 may comprise a series of two (or more) inverter elements 401, 402 as it has been determined that the exact value of the threshold voltage of the comparator does not affect the oscillation frequency. In other examples, a plurality of suitably interconnected logic gates may be utilised to approximate inverter elements 401, 402. In other examples, comparison element 206 may comprise a differential input comparator or any other type of comparator.

In some examples, charged storage arrangement 408 may comprise switching module 422, feedback capacitor, Cf, 310 and switched charge storage arrangement 412. In this example, switching module 422 may comprise a 4 bit linear feedback shift register (LFSR) that may comprise, in some examples, a series of flip flops 403, 404, 405, 406, 407 and one or more exclusive OR (XOR) gates 409. In other examples, switching module 422 may comprise any number of bits, which may be represented by flip flops, latches or any logic equivalent, for example. In some examples, the switching module 422 may be operable to provide a pseudo-random switching sequence. In some examples, switching module 422 may comprise a series of AND gates 411, 413, 415 and 417 (or types of logic gates, buffers or push-pull switches, etc.) to drive charged storage arrangement 408. In other examples, the output of a LFSR may be connected directly to switched change storage arrangement 412.

In some examples, switched charge storage arrangement 412 may comprise a charged storage device C-2C ladder network. By analogy with R-2R ladder networks, the maximum capacitance simultaneously switched in parallel to a feedback capacitor (Cf) may be analytically determined as being equivalent to '2C', irrespective of a number of taps in the ladder (e.g. number of bits used), or Ca='2C'. To be more precise, a maximum $Ca=(2^N-1)/2^{(N-1)}*'C'$ is valid, which approaches '2C' as 'N' increases. In other examples, the grounded terminal capacitance 419 may be driven by switching module 422 to unconditionally have a maximum Ca='2C'. In some examples, the oscillation frequency of the oscillator circuit 300 may be any value between the minimum and maximum oscillation frequency, or Ca may be made any value between '0' and '2C', by enabling one or more charge storage devices within switched charge storage arrangement 412 in a periodic or pseudo-random fashion. In a similar manner to R-2R ladders, C-2C may provide the same advantages of an inexpensive and relatively easy to manufacture solution, since only 3*N−1 unit capacitors are required. This is in contrast to weighted capacitor array that requires $2^N-1$ unit capacitors.

As an outcome of the above spread spectrum clock generation, an advantage of utilising a capacitive ladder network as a switched charge storage arrangement 412 may be that the minimum and maximum frequencies for spread spectrum clock generation are not dependent on the number of bits of the switching module 422. Further, utilising a capacitive ladder network as switched charge storage arrangement 412 may allow for fewer devices to be utilised than currently utilised in the art for a given bit size of clock frequency spreading or switching module.

It is noted that C-2C ladders for DACs are rarely used in an integrated implementation due to the presence of an intrinsic parasitic capacitance associated with an integrated capacitance's bottom plate. The influence of parasitic capacitances thus appears as missing codes (gaps) in the transfer function of the DAC. However, and notably, the inventors have recognised that such a concern is not a problem when implemented for spread spectrum spreading/dithering.

In some generic examples, a C-2C ladder of switched charge storage elements 422 may be implemented with a different radix than '2' (e.g. between '1' and '2', or more than '2'). In further examples, a charge scaling DAC approach may be used, whereby the circuit appears as a superposition of a binary-weighted DAC together with a C-2C DAC.

In some examples, switching module 422 may be a 4-bit LFSR switching switched charge storage arrangement 412, which in some examples may be a ladder network. In some examples, the ladder network may comprise unit capacitance 'C' 419 operably coupled to a further unit capacitance '2C' 421 for each logic gate 411, 413, 415 and wherein the $n^{th}$ logic gate, in this example logic gate 417, may comprise unit capacitance 'C' 419 operably coupled to a grounded further unit capacitance 'C' 419. In some examples, the charge storage elements 419, 421 may alternate between any two values of unit capacitance, for example 'C' and '4C' (which is an example of a different radix=4), '2C' and '4C', etc. In other examples, the charge storage elements may all have varying values of unit capacitance. In further examples, the charge storage elements may all have substantially the same value of unit capacitance. In yet further examples, the charge storage elements may combine a ladder network with a weighted network.

In this example, a total of '11C' unit capacitances may be required to implement the 4-bit ladder network, whilst Cf='20C' is needed for $\Delta f_{osc}/f_{osc}$=10%, Ca='2C'. In comparison, a weighted capacitor array designed for the same frequency spreading performance would utilise a total of '150C'+'15C' unit capacitances. Therefore, there is a significant decrease in the number of unit capacitances required if utilising a ladder network. In some examples, it may be necessary to utilise a switching module with more bits, for example, to minimize emission magnitude and/or to reduce the onset of periodicity in a pseudo-random (or in a systematic) switching sequence. In some examples, switching module 422 may comprise a 10-bit LFSR switching a capacitive ladder network (as switched charge storage arrangement 412), which now requires '29C' unit capacitance (e.g. 11*'C' unit capacitances and 9*'2C' unit capacitances) for C-2C ladder network ('1023C' for weighted capacitor array).

Figure 5:
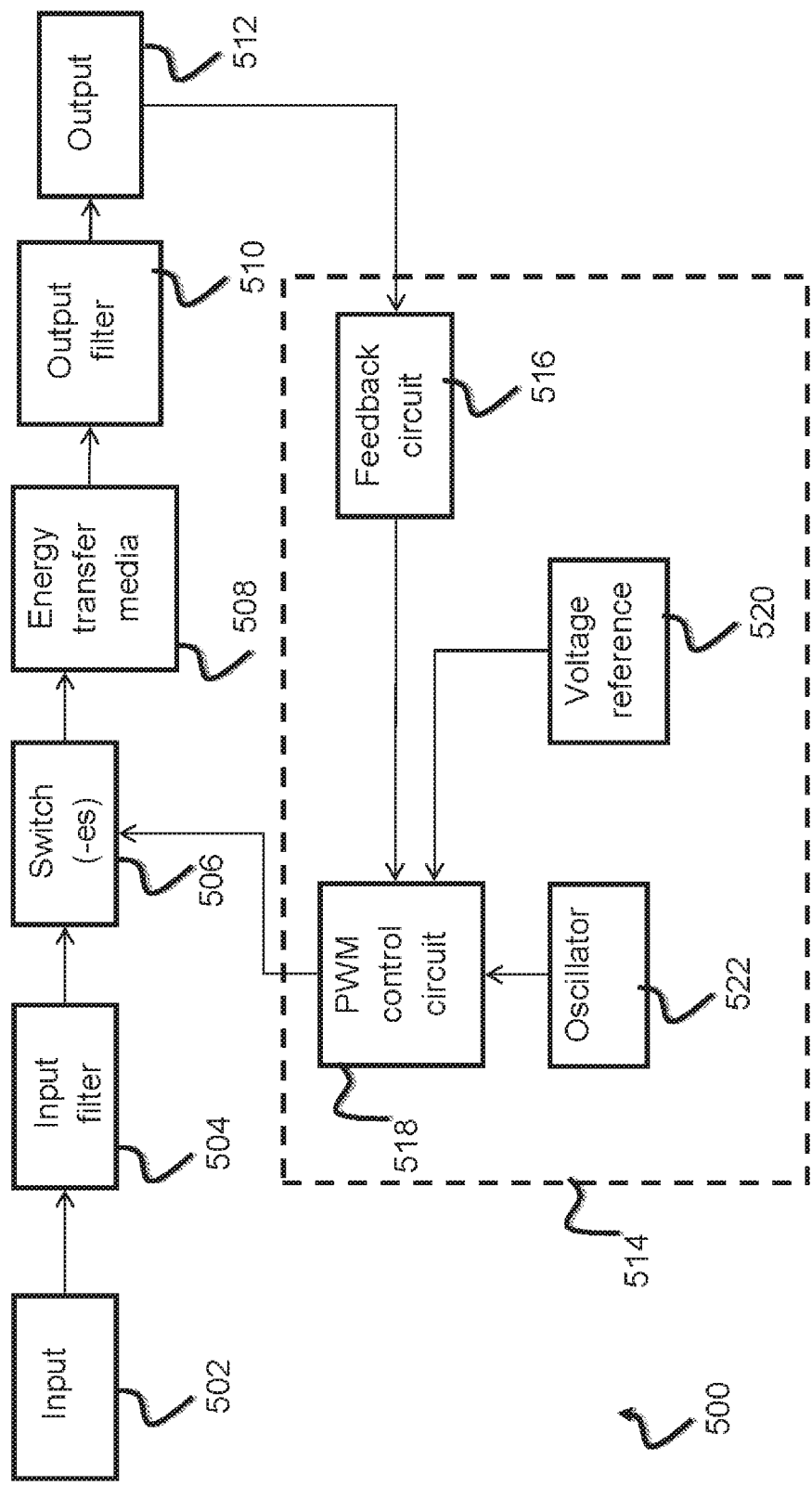
FIG. 5 illustrates a simplified example block diagram of a switched-mode power supply unit.

Referring next to FIG. 5, there is illustrated an example of a simplified block diagram of part of an electronic device 500 adapted in accordance with an example of the present invention. The illustrated example apparatus is a switched-mode power supply (SMPS) unit, such as a DC/DC converter. However, the concepts described herein may equally be applied to any system/component operable at a clock frequency defined by an internal or external oscillator circuit e.g. to microcontrollers, integrated digital/logic cores, etc.

The electronic device 500 comprises an input energy source 502 operably coupled to input filter 504 and then coupled to one or more switch(es) 506 that is/are arranged to control energy transfer media 508. As is known in the art, switch(es) 506 may be at least one electrical device that can break an electrical circuit, interrupting the current or diverting it from one conductor to another, for example a type of relay, field effect transistor (FET, MOSFET, JFET), bipolar junction transistor (BJT), isolated gate bipolar transistor (IGBT) or different types of silicon controlled rectifier (SCR), etc. Energy transfer media 508 may be at least one electrical device that can store energy, for example an inductor or capacitor. Energy transfer media 508 is operably coupled to output filter 510, which in turn is operably coupled to output (or load) 512.

In order to provide accurate output voltage/current values, the illustrated electronic device 500 further comprises negative feedback 514 that contains feedback circuit 516, pulse wave modulated (PWM) control circuit 518, voltage/current reference circuit 520. The PWM control circuit 518 controls the one or more switch(es) 506, which are switched with a fixed frequency that has a duty circle as a function of a difference between the signals provided by the feedback circuit 518 and voltage/current reference circuit 520. The fixed frequency is provided by oscillator circuit 522, which sets an operation/clock frequency of the whole system of SMPS.

In accordance with one example, oscillator circuit 522 is a spread-spectrum clock generation oscillator circuit as previously described, which may negate or reduce any switching noise (and/or undesired electromagnetic interference (EMI) which may exceed the regulatory limits requested to SMPS) created by the one or more switch(es) 506.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A spread-spectrum clock generation circuit comprising:
   at least one comparison element;
   a shunt charge storage device operably coupled to the at least one comparison element and arranged to limit a voltage applied thereto;
   at least one charge storage device arranged to couple an output of the at least one comparison element to an input of the at least one comparison element and arranged to set a first oscillation frequency of the spread-spectrum clock generation circuit; and
   a switched charge storage arrangement additionally arranged to couple an output of the at least one comparison element to an input of the at least one comparison element and arranged to set a second oscillation frequency of the spread-spectrum clock generation circuit.

2. The spread-spectrum clock generation circuit of claim 1 wherein the charge storage device is at least one feedback capacitor.

3. The spread-spectrum clock generation circuit of claim 1 wherein the switched charge storage arrangement comprises a plurality of individually switchable charge storage devices.

4. The spread-spectrum clock generation circuit of claim 3 wherein a number of the plurality of individually switchable charge storage devices are dynamically selected thereby altering a switching frequency of the spread-spectrum clock generation circuit.

5. The spread-spectrum clock generation circuit of claim 3 wherein the plurality of individually switchable charge storage devices are operably coupled to a switching arrangement for selectively applying a number of the individually switchable charge storage devices to be located in parallel to the feedback capacitor.

6. The spread-spectrum clock generation circuit of claim 3 wherein a number of the plurality of individually switchable charge storage devices sets at least one from a group comprising:
   a frequency modulation of the oscillation frequency of the spread-spectrum clock generation circuit;
   a frequency spreading of the oscillation frequency of the spread-spectrum clock generation circuit;
   a dithering of the oscillation frequency of the spread-spectrum clock generation circuit.

7. The spread-spectrum clock generation circuit of claim 3, wherein the individually switchable charge storage devices are selected in an asynchronous manner.

8. The spread-spectrum clock generation circuit of claim 2 wherein the at least one feedback capacitor sets a maximum oscillation frequency of the spread-spectrum clock generation circuit when no individually switchable charge storage device is applied in parallel.

9. The spread-spectrum clock generation circuit of claim 1 wherein selection of an individually switchable charge storage device of the switched charge storage arrangement together with the at least one charge storage device sets a range of oscillation frequencies of the spread-spectrum clock generation circuit.

10. The spread-spectrum clock generation circuit of claim 3 wherein a minimum oscillation frequency of the spread-spectrum clock generation circuit is set when each of the individually switchable charge storage devices is applied.

11. The spread-spectrum clock generation circuit of claim 3 wherein the plurality of individually switchable charge storage devices form a weighted capacitor array.

12. The spread-spectrum clock generation circuit of claim 2, wherein the switched charge storage arrangement comprises a capacitive ladder network arranged to represent the individually switchable charge storage devices.

13. The spread-spectrum clock generation circuit of claim 12, wherein the capacitive ladder network comprises a plurality of individually switchable capacitor arrays.

14. The spread-spectrum clock generation circuit of claim 3, wherein a number of the plurality of individually switchable charge storage devices that are applied in parallel sets a clock-frequency spreading bandwidth of the spread-spectrum clock generation circuit.

15. The spread-spectrum clock generation circuit of claim 1, wherein the comparison element is a single threshold comparator.

16. An integrated circuit comprising the spread-spectrum clock generation circuit according to claim 1.

17. A spread-spectrum clock generation circuit comprising:
at least one comparison element;
at least one charge storage device arranged to couple an output of the at least one comparison element to an input of the at least one comparison element and arranged to set a first oscillation frequency of the spread-spectrum clock generation circuit; and
a switched charge storage arrangement additionally arranged to couple an output of the at least one comparison element to an input of the at least one comparison element and arranged to set a second oscillation frequency of the spread-spectrum clock generation circuit, wherein the switched charge storage arrangement comprises a plurality of individually switchable charge storage devices, and wherein the number of individually switchable charge storage devices is controlled by at least one from a group comprising: a programmable pseudo-random-number generator, a linear feedback shift register.

18. An apparatus comprising an oscillator circuit having:
at least one comparison element;
a shunt charge storage device operably coupled to the at least one comparison element and arranged to limit a voltage applied thereto;
at least one charge storage device arranged to couple an output of the at least one comparison element to an input of the at least one comparison element and arranged to set a first oscillation frequency of the spread-spectrum clock generation circuit; and
a switched charge storage arrangement additionally arranged to couple an output of the at least one comparison element to an input of the at least one comparison element and arranged to set a second oscillation frequency of the spread-spectrum clock generation circuit.

19. The apparatus of claim 18 wherein the apparatus is a switched-mode power supply or a synchronous digital system.

* * * * *